US009349567B2

(12) United States Patent
Takahoko et al.

(10) Patent No.: US 9,349,567 B2
(45) Date of Patent: May 24, 2016

(54) CHARGED PARTICLE BEAM DEVICE

(71) Applicant: Hitachi High-Technologies Corporation, Minato-ku, Tokyo (JP)

(72) Inventors: Yoshihiro Takahoko, Tokyo (JP);
Daisuke Kobayashi, Tokyo (JP);
Masashi Kimura, Tokyo (JP);
Masahiro Sasajima, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 14/787,118

(22) PCT Filed: Apr. 23, 2014

(86) PCT No.: PCT/JP2014/061393
§ 371 (c)(1),
(2) Date: Oct. 26, 2015

(87) PCT Pub. No.: WO2014/181685
PCT Pub. Date: Nov. 13, 2014

(65) Prior Publication Data
US 2016/0086766 A1  Mar. 24, 2016

(30) Foreign Application Priority Data

May 10, 2013 (JP) ................................. 2013-100464

(51) Int. Cl.
*H01J 37/02* (2006.01)
*H01J 37/00* (2006.01)
(Continued)

(52) U.S. Cl.
CPC ................. *H01J 37/18* (2013.01); *H01J 37/21* (2013.01); *H01J 37/22* (2013.01); *H01J 2237/26* (2013.01); *H01J 2237/30* (2013.01)

(58) Field of Classification Search
USPC ......... 250/306, 307, 309, 310, 441.11, 492.1, 250/492.3
See application file for complete search history.

(56) References Cited

U.S. PATENT DOCUMENTS 9,263,234 B2 * 2/2016 Koning .................... G03F 7/708
2008/0315122 A1 12/2008 Katagiri et al.
(Continued)

FOREIGN PATENT DOCUMENTS

JP 49-107949 U 9/1974
JP 2009-4112 A 1/2009
(Continued)

OTHER PUBLICATIONS

International Search Report (PCT/ISA/210) issued in PCT Application No. PCT/JP2014/061393 dated Jun. 3, 2014 with English-language translation (four (4) pages).
(Continued)

*Primary Examiner* — Bernard Souw
(74) *Attorney, Agent, or Firm* — Crowell & Moring LLP

(57) ABSTRACT

An evacuation structure of a charged particle beam device includes: a vacuum chamber provided with a charged particle source; vacuum piping connected to the vacuum chamber; a main vacuum pump which is connected via the vacuum piping and evacuates the inside of the vacuum chamber; a non-evaporable getter pump disposed at a position between the vacuum chamber and the main vacuum pump in the vacuum piping; and a coarse evacuation port connected at a position between the vacuum chamber and the non-evaporable getter pump in the vacuum piping The coarse evacuation port includes: a coarse evacuation valve that opens and closes the coarse evacuation port; and a leak valve to open the vacuum chamber to the atmosphere.

5 Claims, 6 Drawing Sheets

(51) Int. Cl.
*H01J 37/18* (2006.01)
*H01J 37/22* (2006.01)
*H01J 37/21* (2006.01)

(56) References Cited

U.S. PATENT DOCUMENTS

| | | |
|---|---|---|
| 2009/0008572 A1 | 1/2009 | Ogawa et al. |
| 2011/0089336 A1 | 4/2011 | Kasuya et al. |
| 2013/0200788 A1 | 8/2013 | Cho et al. |
| 2015/0090895 A1* | 4/2015 | Koning ................ G03F 7/708 250/396 R |
| 2015/0206705 A1* | 7/2015 | Sakuma ................ H01J 37/20 250/453.11 |
| 2015/0213999 A1* | 7/2015 | Ominami ............... H01J 37/16 250/310 |
| 2015/0221470 A1* | 8/2015 | Ominami ............... H01J 37/16 250/441.11 |
| 2015/0228447 A1* | 8/2015 | Ominami ............... H01J 37/16 250/307 |
| 2015/0228448 A1* | 8/2015 | Ominami ............... H01J 37/18 250/441.11 |
| 2015/0311033 A1* | 10/2015 | Ominami ............... H01J 37/16 250/307 |
| 2015/0318143 A1* | 11/2015 | Ominami ............... H01J 37/16 250/307 |
| 2016/0071695 A1* | 3/2016 | Torregrosa .......... H01J 37/3171 250/492.21 |

FOREIGN PATENT DOCUMENTS

| | | |
|---|---|---|
| JP | 2010-177004 A | 8/2010 |
| WO | WO 2007/086254 A1 | 8/2007 |
| WO | WO 2009/153939 A1 | 12/2009 |
| WO | WO 2011/102077 A1 | 8/2011 |

OTHER PUBLICATIONS

Japanese-language Written Opinion (PCT/ISA/237) issued in PCT Application No. PCT/JP2014/061393 dated Jun. 3, 2014 (three (3) pages).

* cited by examiner

CHARGED PARTICLE BEAM DEVICE

TECHNICAL FIELD

The present invention relates to a charged particle beam device.

BACKGROUND ART

In a charged particle beam device, such as a scanning electron microscope, a transmission electron microscope, an ion microscope, and a semiconductor inspection device, a sample is irradiated with charged particle beams generated under a high vacuum environment, and an observation image of the sample is acquired by detecting electrons reflected at the sample, electrons passing through the sample, secondary electrons emitted from the sample, or the like.

There is a scanning electron microscope (SEM) as a representative example of the charged particle beam device. The scanning electron microscope includes an electron gun formed of an electron source of a field emission type or a thermal field emission type, and electron beams emitted from the electron gun are accelerated and made into thin electron beams at an electron lens. In the scanning electron microscope, the sample is scanned with the electron beams as primary electron beams by using a scan deflector, and an image is acquired by detecting obtained secondary electrons or reflected electrons. As a material of the electron source, tungsten is used in the case of a general-purpose SEM. Further, as a material of the electron source used for semiconductor observation, zirconia may be contained in tungsten.

In order to emit good electron beams from the electron source for a long period, the vicinity of the electron source is needed to be kept in a high vacuum state ($10^{-7}$ to $10^{-8}$ Pa). Therefore, in the related art, there is a method of forcedly evacuating air in the vicinity of the electron gun with an ion pump. Further, there is a charged particle beam device in which a higher vacuum state is obtained by including a non-evaporable getter pump (PTL 1, for example).

CITATION LIST

Patent Literature

PTL 1: JP 2009-4112 A

SUMMARY OF INVENTION

Technical Problem

The inventors of the present application earnestly studied on a case where a vacuum chamber to be evacuated by a non-evaporable getter pump is opened to the atmosphere, and as a result, the inventors reached to the following findings.

Generally, porous alloy mainly including zirconium (Zr) is used as a getter material of the non-evaporable getter pump. Active gas remaining in vacuum is decomposed on a surface of the getter material, and oxide, nitride, and carbide are formed with the getter material and chemically adsorbed. An adsorption speed is decreased as the surface of the getter material is saturated with adsorption gas, but the surface of the getter material is cleaned by heating the getter material and expediting diffusion (referred to as activation) of adsorption gas components to the inside of the getter material, thereby enabling further adsorption.

In a non-evaporable getter, the getter material is obtained by dissolving zirconium and other metallic materials to obtain alloy, crushing the obtained alloy, and then pressing the crushed alloy into a predetermined shape. Therefore, when the non-evaporable getter pump exits in a flow passage via which air flows into the vacuum chamber when the vacuum chamber is opened to the atmosphere by opening a leak valve, it is found that the getter material may be partly scattered by the air flow as fine particles, and the fine particles may be scattered into the vacuum chamber. In the case where the fine particles are scattered into the vacuum chamber and adhere to an electrode to which high voltage is applied, there may be a problem in which electricity is discharged at the time of emitting electrons, and the electron source is damaged.

The present invention is directed to preventing such fine particles of the non-evaporable getter pump from being scattered into the vacuum chamber.

Solution to Problem

To solve the above problems, for example, a structure recited in the scope of claims is adopted. While the present application includes a plurality of means to solve the above-described problems, provided is an example of a charged particle beam device including: a charged particle optical system that introduces charged particle beams emitted from a charged particle source (electron source, ion source, etc.) onto a sample; and an evacuation structure to evacuate the charged particle optical system. The evacuation structure includes: a vacuum chamber provided with the charged particle source (electron gun chamber, ion gun chamber, etc.); vacuum piping connected to the vacuum chamber; a main vacuum pump which is connected via the vacuum piping and evacuates the inside of the vacuum chamber; a non-evaporable getter pump disposed at a position between the vacuum chamber and the main vacuum pump in the vacuum piping; and a coarse evacuation port which is connected to at a position between the vacuum chamber and the non-evaporable getter pump in the vacuum piping and includes a coarse evacuation valve to open and close the coarse evacuation port and a leak valve to open the vacuum chamber to the atmosphere.

Further, as another example, the evacuation structure includes: a vacuum chamber provided with the charged particle source; vacuum piping connected to the vacuum chamber; a main vacuum pump which is connected via the vacuum piping and evacuates the inside of the vacuum chamber; a non-evaporable getter pump disposed at a position between the vacuum chamber and the main vacuum pump in the vacuum piping; and a coarse evacuation port which is connected to the vacuum chamber and includes a coarse evacuation valve to open and close the coarse evacuation port and a leak valve to open the vacuum chamber to the atmosphere.

Furthermore, as still another example, the evacuation structure includes: a vacuum chamber provided with the charged particle source; vacuum piping connected to the vacuum chamber; a main vacuum pump which is connected via the vacuum piping and evacuates the inside of the vacuum chamber; a non-evaporable getter pump disposed at a position between the vacuum chamber and the main vacuum pump in the vacuum piping; a coarse evacuation port which is connected to a position between the main vacuum pump and the non-evaporable getter pump in the vacuum piping, and includes a coarse evacuation valve to open and close the coarse evacuation port and a leak valve to open the vacuum chamber to the atmosphere; and an air introducing guide disposed at a connecting position between the coarse evacuation port and the vacuum piping. An introduction port of the air introducing guide extends up to the vacuum chamber side beyond the non-evaporable getter pump.

Advantageous Effects of Invention

According to the present invention, fine particles in the non-evaporable getter pump are scattered toward the main vacuum pump even at the time of opening the vacuum chamber to the atmosphere, and there is little possibility that the fine particles once captured at the main vacuum pump are scattered again to the vacuum chamber during evacuation after opening the vacuum chamber to the atmosphere. Therefore, the fine particles can be prevented from being scattered into the vacuum chamber.

More features related to the present invention will be apparent from the description of the present specification and the accompanying drawings. Further, other problems, structures, and effects in addition to those described above will be apparent from description of the following embodiments.

DESCRIPTION OF EMBODIMENTS

Embodiments of the present invention will be described with reference to the accompanying drawings. Note that specific embodiments according to the principle of the present invention are illustrated in the accompanying drawings, but these are provided for the purpose of understanding the present invention and not used to interpret the present invention in a limited way.

A charged particle beam device is a device that accelerates particles which are electrically charged, such as electrons and cations (charged particles), in an electric field and irradiates a sample with these particles. The charged particle beam device is adapted to perform observation, analysis, processing for a sample by utilizing interaction between the sample and the charged particles. The present invention is applicable to a scanning electron microscope, a scanning transmission electron microscope, a transmission electron microscope, an ion microscope, a focused ion beam device, a composite device thereof combined with a sample processing device, or an analysis/test device to which the mentioned microscopes and devices are applied.

Figure 1:
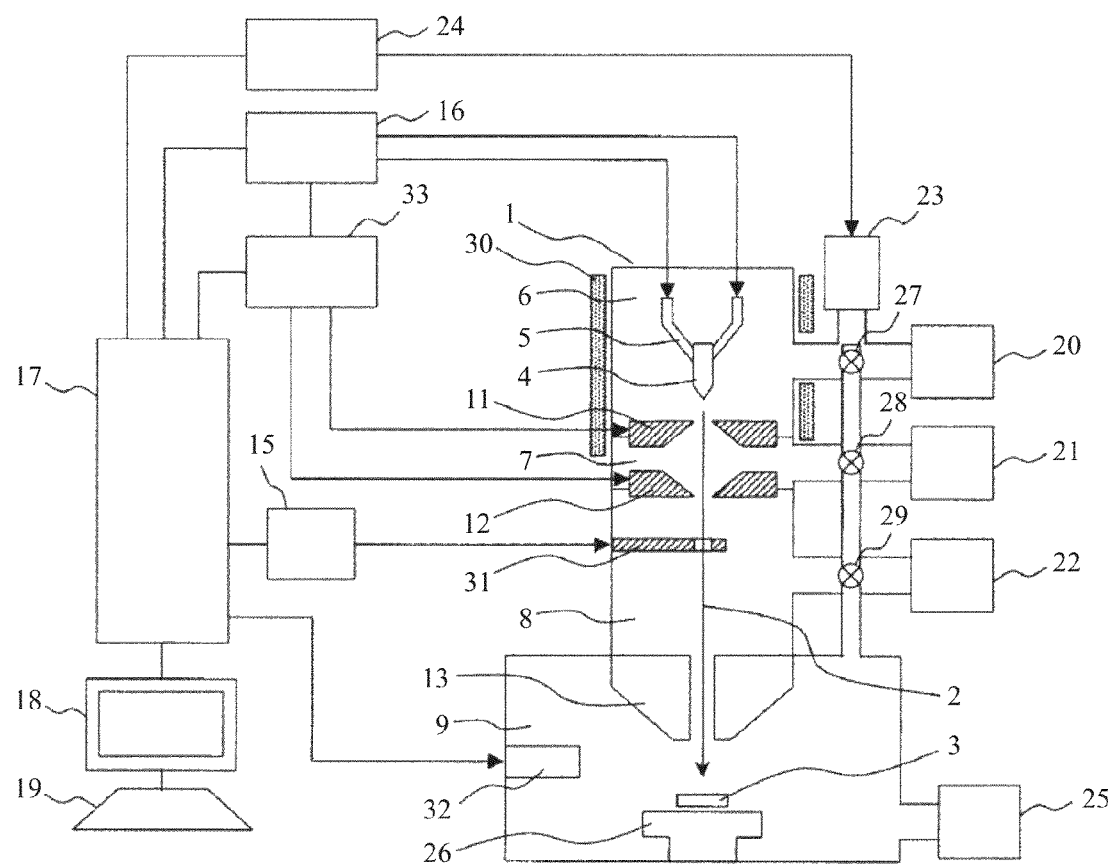
FIG. 1 is a schematic block diagram of a scanning electron microscope to which an embodiment of the present invention is applied.

In the following, a scanning electron microscope (SEM) will be described as an example of the charged particle beam device. FIG. 1 is a schematic block diagram of the scanning electron microscope to which an embodiment of the present invention is applied. The scanning electron microscope includes: an electronic optical system that irradiates a sample with electron beams emitted from an electron source; and an evacuation structure in order to evacuate the electronic optical system.

In an electron microscope, a sample 3 is irradiated with primary electron beams 2 emitted from the electron source 4 inside a mirror body 1, and the sample 3 is observed by detecting, with a detector, secondary electron beams generated thereby.

The mirror body 1 includes the electron source 4, a deflector to deflect the primary electron beams 2, an objective lens 13 to focus the primary electron beams 2 on the sample 3, a plurality of stops (e.g., stop electrode 31), and so on. Note that the mirror body 1 may include other lens, electrode, detector besides the above components or may include components partly different from the above components, and the components of the electronic optical system are not limited thereto.

For the electron source 4, a single crystal tungsten wire in a <310> direction including a sharpened tip is used. The electron source 4 is fixed to a tip of a tungsten filament 5, and disposed inside a vacuum chamber 6. The vacuum chamber 6 is evacuated by a main vacuum pump 20 and an auxiliary vacuum pump 23 (non-evaporable getter pump) and kept at $1 \times 10^{-8}$ Pa or less, particularly, $1 \times 10^{-9}$ Pa or less. Once the auxiliary vacuum pump 23 is heated by a heating unit 24, the auxiliary vacuum pump 23 continues evacuation even after a temperature reaches to ordinary temperatures.

The vacuum chamber 6 is connected to a first intermediate chamber 7 via a small opening (aperture) at a center of an extraction electrode 11. Further, the first intermediate chamber 7 is connected to a second intermediate chamber 8 via an aperture of an acceleration electrode 12. An upper structure above the second intermediate chamber 8 is normally used as an FE electron gun. The second intermediate chamber 8 is connected to a sample chamber 9 via an aperture of the objective lens 13. The first intermediate chamber 7 is evacuated by an ion pump 21, the second intermediate chamber 8 is evacuated by an ion pump 22, and a sample chamber 9 is evacuated by a turbo-molecular pump 25. Therefore, the present embodiment is a differential evacuation structure in which a plurality of vacuum chambers is connected via the openings.

First, the electron source 4 is flashed by a flashing power supply 16 until an adsorption layer is eliminated (operation to heat the electron source 4 for a short period). After that, extraction voltage is applied by a high-voltage power supply 33 between the electron source 4 and the extraction electrode 11, and the electron beams 2 are emitted from the electron source 4.

The electron beams 2 are accelerated by acceleration voltage applied between the electron source 4 and the acceleration electrode 12 by the high-voltage power supply 33, and reach the second intermediate chamber 8. An emission angle of the used electron beams 2 is determined by passing the electron beams 2 through the aperture provided at the stop electrode 31 and removing an outer peripheral portion. Further, variation of emitted current is monitored by connecting a current detector 15 to the stop electrode 31. Monitoring current emission can be also performed by detecting entire current emitted from the electron source 4 with the current detector 15.

After that, the electron beams 2 are focused by the objective lens 13, and the sample 3 placed on a sample table 26 is irradiated with the focused electron beams. Then, electrons emitted from the sample 3 are detected by an emitted electron detector 32, and processing is applied by a control device 17, thereby acquiring an observation image. The acquired observation image is displayed on a display device 18 by operating an operation device 19.

Note that, before using the device or when maintenance is carried out every few months, baking operation to heat the vacuum chamber 6 is performed by an electron gun heater 30. By baking, gas emitted from a wall surface of the vacuum chamber 6 is depleted, and the vacuum chamber 6 can be kept at $1\times10^{-8}$ Pa or less in the normal operation. Baking is also performed for the first intermediate chamber 7 and the second intermediate chamber 8. During baking, a coarse evacuation valve 27, a coarse evacuation valve 28, and a coarse evacuation valve 29 are opened, and evacuation is performed in combination with the ion pump 21, ion pump 22, and turbomolecular pump 25.

The present embodiment includes a structure functioning as both a coarse evacuation port and an air leak evacuation port, which will be described below by using the drawings. The coarse evacuation port including the coarse evacuation valve 27 is branched into two portions, and a coarse evacuation pump is connected to one of the branched portions and a leak valve is provided at the other one of the branched portions. Opening the vacuum chamber to the atmosphere is achieved by opening the coarse evacuation valve 27 and the leak valve.

First Embodiment

Figure 2:
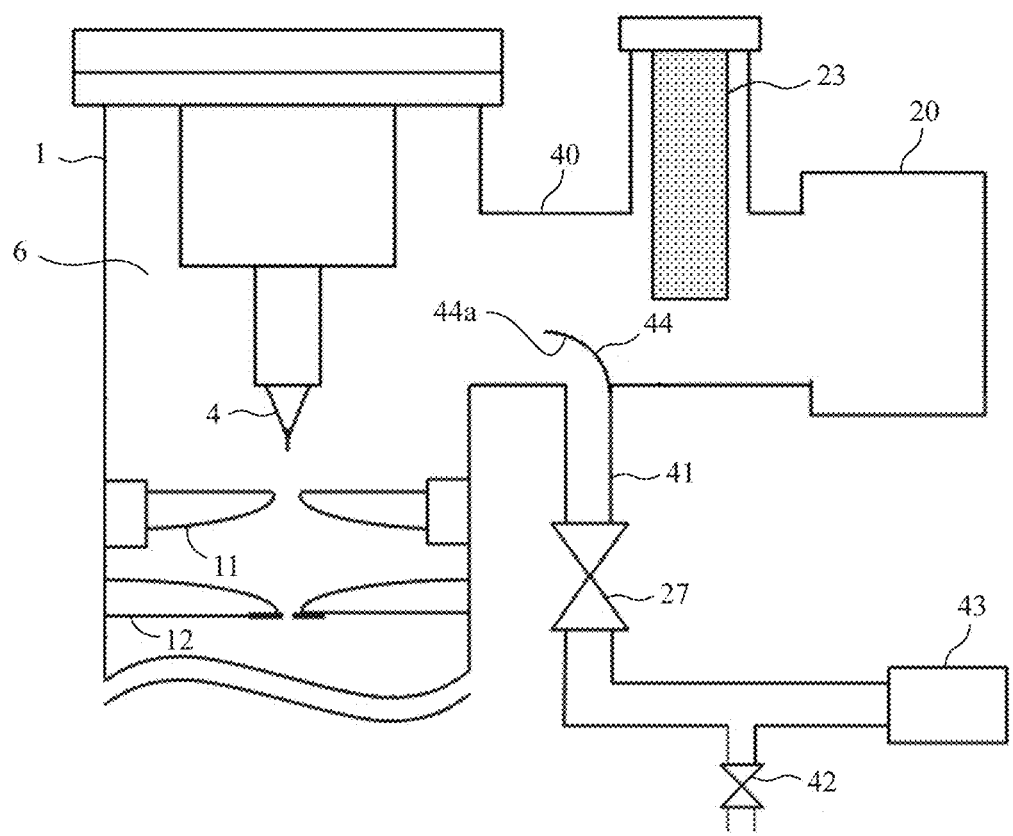
FIG. 2 is a diagram illustrating an evacuation structure according to a first embodiment.

FIG. 2 is a diagram illustrating an evacuation structure according to a first embodiment. A vacuum chamber 6 where an electron source 4 is disposed is connected to vacuum piping 40. The vacuum chamber 6 is connected to a main vacuum pump 20 via the vacuum piping 40. An auxiliary vacuum pump 23 is disposed at a position between the main vacuum pump 20 and the vacuum chamber 6 in the vacuum piping 40. In other words, the auxiliary vacuum pump 23 is disposed closer to the vacuum chamber 6 side than the main vacuum pump 20.

A coarse evacuation port (coarse evacuation opening) 41 is connected to a position between the auxiliary vacuum pump 23 and the vacuum chamber 6 in the vacuum piping 40. In other words, the coarse evacuation port 41 is disposed closer to the vacuum chamber 6 than the auxiliary vacuum pump 23.

The coarse evacuation port 41 includes a coarse evacuation valve 27. Further, the coarse evacuation port 41 is branched in two portions, and a coarse evacuation pump 43 is connected to one of the branched portions and a leak valve 42 is provided at the other one of the branched portions. Further, a connecting portion between the coarse evacuation port 41 and the vacuum piping 40 is provided with an air introducing guide 44. An introduction port 44a of the air introducing guide 44 is directed to the vacuum chamber 6 side.

In a basic leakage process in which a state is changed from a high vacuum to the atmosphere, the leak valve 42 is opened after opening the coarse evacuation valve 27, and kept as it is until the pressure reaches an atmospheric pressure.

Figure 3:
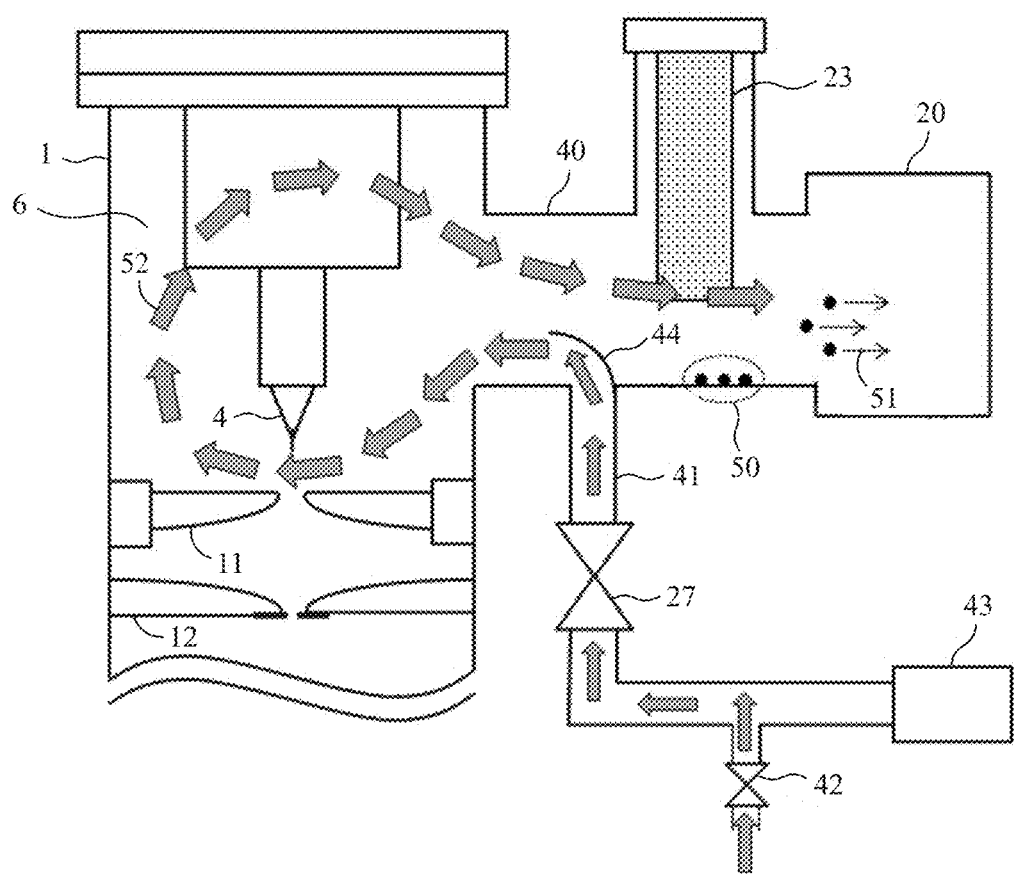
FIG. 3 is an explanatory diagram for an evaluation test in the first embodiment.
Figure 4:
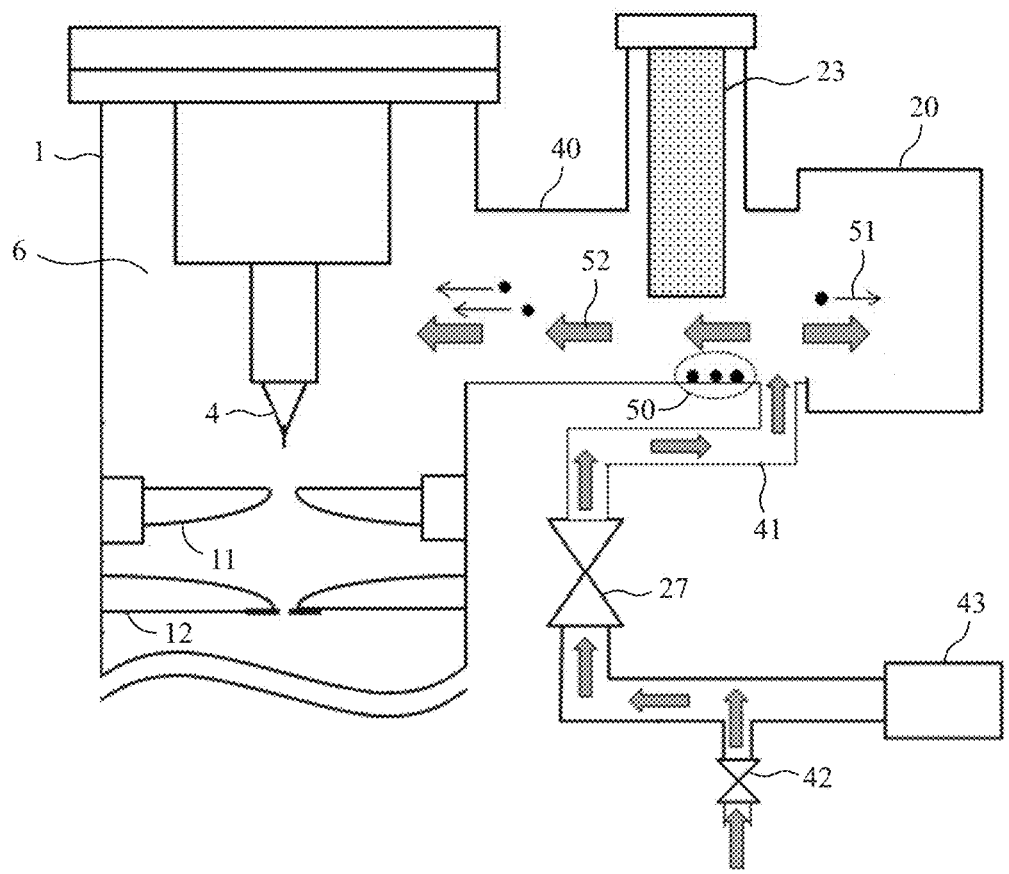
FIG. 4 is an explanatory diagram illustrating an evaluation test in a comparative example.

An Effect of the present embodiment is evaluated by performing a scattering test of fine particles in the case of opening the vacuum chamber to the atmosphere in the leakage process. The evaluation test is carried out for two cases. One case is a structure according to the present embodiment in which the coarse evacuation port 41 is provided between the vacuum chamber 6 and the auxiliary vacuum pump 23 as illustrated in FIG. 3. The other case is a comparative example in which the coarse evacuation port 41 is disposed closer to the main vacuum pump 20 side than the auxiliary vacuum pump 23 as illustrated in FIG. 4. FIGS. 3 and 4 illustrate the fine particles 50, behavior 51 of the fine particles 50 while opening the vacuum chamber to the atmosphere, and an air flow 52 while opening the vacuum chamber to the atmosphere.

In FIG. 3, the air flow 52 while opening the vacuum chamber to the atmosphere is directed to the vacuum chamber 6 by the air introducing guide 44. The air flows to the main vacuum pump 20 after flowing inside the vacuum chamber 6. Due to this, the behavior 51 of the fine particles 50 while opening the vacuum chamber to the atmosphere is to be movement in a direction to the main vacuum pump 20 side. Therefore, the fine particles 50 can be prevented from being scattered to the vacuum chamber 6 where the electron source 4 is disposed. The fine particles 50 scattered to the main vacuum pump 20 side are scattered to the main vacuum pump 20 side during evacuation of the vacuum chamber 6 after opening the vacuum chamber to the atmosphere, and may be captured in the main vacuum pump 20. There is little possibility that the fine particles 50 once captured in the main vacuum pump 20 are scattered again to the vacuum chamber 6 during evacuation after opening the vacuum chamber to the atmosphere.

In FIG. 4, the air flow 52 while opening the vacuum chamber to the atmosphere flows in two directions to the vacuum chamber 6 side and to the main vacuum pump 20 side. In FIG. 4, since the coarse evacuation port 41 is disposed between the auxiliary vacuum pump 23 and the main vacuum pump 20, the fine particles 50 are scattered in both directions to the vacuum chamber 6 and to the main vacuum pump 20, and the fine particles 50 cannot be prevented from being scattered to the vacuum chamber 6.

According to the present embodiment, it is possible to provide the charged particle beam device including an electron gun chamber in combination with the auxiliary vacuum pump 23 (non-evaporable getter pump) and the main vacuum pump 20. The auxiliary vacuum pump 23 is disposed at a position between the main vacuum pump 20 and the vacuum chamber 6 in the vacuum piping 40, that is, disposed closer to the vacuum chamber 6 side than the main vacuum pump 20. Further, the coarse evacuation port (coarse evacuation opening) 41 is connected to a position between the auxiliary vacuum pump 23 and the vacuum chamber 6 in the vacuum piping 40, that is, disposed closer to the vacuum chamber 6 than the auxiliary vacuum pump 23. According to this structure, a practical evacuation rate inside the vacuum chamber can be prevented from being reduced, and further, the fine particles 50 of the auxiliary vacuum pump 23 (non-evaporable getter pump) can be prevented from being scattered while opening the vacuum chamber to the atmosphere.

Further, according to the present embodiment, the air introducing guide 44 is provided at the connecting portion between the coarse evacuation port 41 and the vacuum piping 40, and the introduction port 44a of the air introducing guide 44 is directed to the vacuum chamber 6 side. According to this structure, the air while opening the vacuum chamber to the atmosphere can be more efficiently directed to the vacuum chamber 6, and the air flow to the vacuum chamber 6 is stabilized, too. Moreover, a period of opening the vacuum chamber to the atmosphere can be shortened because the air smoothly flows.

Note that, according to the present embodiment, the air introducing guide 44 is provided at the connecting portion between the coarse evacuation port 41 and the vacuum piping 40, but not limited thereto, the structure not including the air introducing guide 44 may be applied, too.

Second Embodiment

Figure 5:
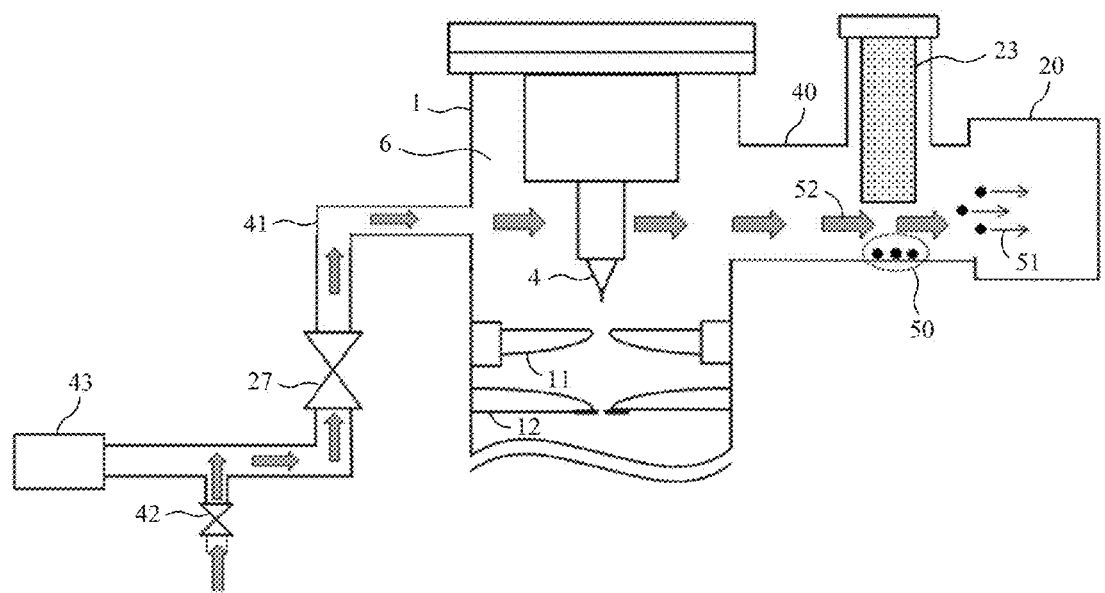
FIG. 5 is a diagram illustrating an evacuation structure according to a second embodiment.

FIG. 5 is a diagram illustrating an evacuation structure according to a second embodiment. In the present embodiment, a coarse evacuation port 41 is directly connected to a vacuum chamber 6 not via vacuum piping 40. For example, the coarse evacuation port 41 is connected to a position opposing to the vacuum piping 40 in the vacuum chamber 6.

According to the present embodiment, an air flow 52 while opening the vacuum chamber to the atmosphere is to be a direction from the vacuum chamber 6 to the main vacuum pump 20. Therefore, behavior 51 of fine particles 50 is to be the behavior moving in a direction to the main vacuum pump 20. As a result, the fine particles 50 can be prevented from being scattered to the vacuum chamber 6 where an electron source 4 is disposed. Further, according to this structure, the coarse evacuation port 41 is directly connected to the vacuum chamber 6. Therefore, a period of opening the vacuum chamber to the atmosphere can be shortened because the air directly flows to the vacuum chamber 6.

Third Embodiment

Figure 6:
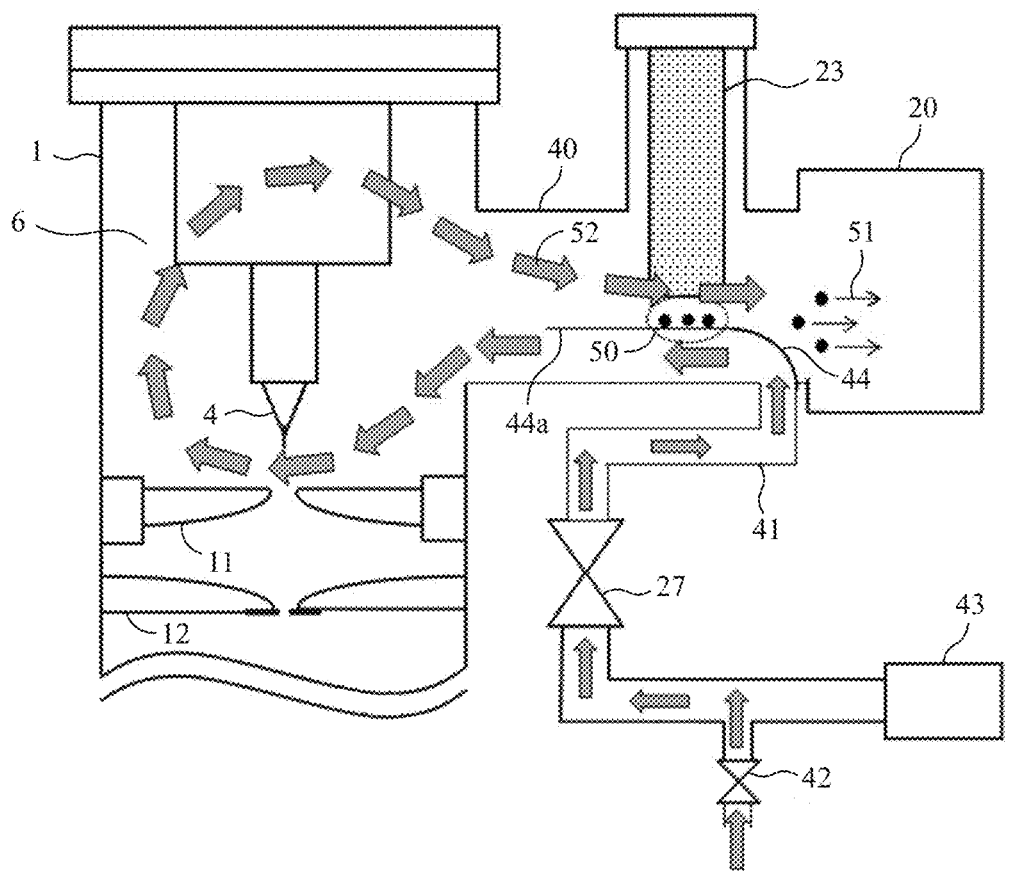
FIG. 6 is a diagram illustrating an evacuation structure according to a third embodiment.

FIG. 6 is a diagram illustrating an evacuation structure according to a third embodiment. In the present embodiment, a coarse evacuation port 41 is disposed between an auxiliary vacuum pump 23 and a main vacuum pump 20 in vacuum piping 40. Further, a connected portion between the coarse evacuation port 41 and the vacuum piping 40 is provided with an air introducing guide 44. An introduction port 44a of the air introducing guide 44 is directed to the vacuum chamber 6 side. Further, the introduction port 44a of the air introducing guide 44 extends up to a position closer to the vacuum chamber 6 side than the auxiliary vacuum pump 23.

According to the present embodiment, an air flow 52 while opening the vacuum chamber to the atmosphere is to be a direction from the vacuum chamber 6 to the main vacuum pump 20. The air flows to the main vacuum pump 20 after flowing inside the vacuum chamber 6. Since the introduction port 44a of the air introducing guide 44 extends up to the position closer to the vacuum chamber 6 side than the auxiliary vacuum pump 23, fine particles 50 are prevented from being caught by the air flow directed to the vacuum chamber 6. As illustrated in FIG. 6, for example, behavior 51 of the fine particles 50 fallen on the air introducing guide 44 is the behavior moving in a direction to the main vacuum pump 20. Therefore, the fine particles 50 can be prevented from being scattered to the vacuum chamber 6 where an electron source 4 is disposed.

Note that the present invention is not limited to the above-described embodiments and may include various modified examples. For example, the embodiments above are described in detail to clearly explain the present invention, and are not necessarily limited to those having all the components described. Additionally, the components of one embodiment can be partly replaced with the components of another embodiment, and a component of one embodiment can also be added to components of a different embodiment. Further, addition, deletion, and substitution of other components can be made to a part of the components of the respective embodiments.

| Reference Signs List | |
|---|---|
| 1 | mirror body |
| 2 | electron beam |
| 3 | sample |
| 4 | electron source |
| 5 | tungsten filament |
| 6 | vacuum chamber |
| 7 | first intermediate chamber |
| 8 | second intermediate chamber |
| 9 | sample chamber |

| Reference Signs List | |
|---|---|
| 11 | extraction electrode |
| 12 | acceleration. electrode |
| 13 | objective lens |
| 15 | current detector |
| 16 | flashing power supply |
| 17 | control device |
| 18 | display device |
| 19 | operation. device |
| 20 | main vacuum pump |
| 21, 22 | ion pump |
| 23 | auxiliary vacuum pump |
| 24 | heating unit |
| 25 | turbo-molecular pump |
| 26 | sample table |
| 27, 28, 29 | coarse evacuation valve |
| 30 | electron gun heater |
| 31 | stop electrode |
| 32 | emitted electron detector |
| 33 | high-voltage power supply |
| 40 | vacuum. piping |
| 41 | coarse evacuation port |
| 42 | leak valve |
| 43 | coarse evacuation pump |
| 44 | air introducing guide |
| 44a | introduction port |

The invention claimed is:

1. A charged particle beam device, comprising:
a charged particle optical system configured to introduce charged particle beams emitted from a charged particle source onto a sample; and
an evacuation structure to evacuate the charged particle optical system,
wherein the evacuation structure includes:
a vacuum chamber provided with the charged particle source;
vacuum piping connected to the vacuum chamber;
a main vacuum pump connected via the vacuum piping and configured to evacuate the inside of the vacuum chamber;
a non-evaporable getter pump disposed at a position between the vacuum chamber and the main vacuum pump in the vacuum piping; and
a coarse evacuation port connected to a position between the vacuum chamber and the non-evaporable getter pump in the vacuum piping, and including a coarse evacuation valve configured to open and close the coarse evacuation port and a leak valve to open the vacuum chamber to the atmosphere.

2. The charged particle beam device according to claim 1, further comprising an air introducing guide disposed at a connecting position between the coarse evacuation port and the vacuum piping, wherein an introduction port of the air introducing guide is directed to the vacuum chamber side.

3. A charged particle beam device, comprising:
a charged particle optical system configured to introduce charged particle beams emitted from a charged particle source onto a sample; and
an evacuation structure to evacuate the charged particle optical system,
wherein the evacuation structure includes:
a vacuum chamber provided with the charged particle source;
vacuum piping connected to the vacuum chamber;
a main vacuum pump connected via the vacuum piping and configured to evacuate the inside of the vacuum chamber;

a non-evaporable getter pump disposed at a position between the vacuum chamber and the main vacuum pump in the vacuum piping; and a coarse evacuation port connected to the vacuum chamber, and including a coarse evacuation valve configured to open and close the coarse evacuation port and a leak valve to open the vacuum chamber to the atmosphere.

4. The charged particle beam device according to claim 3, wherein the coarse evacuation port is connected to a position opposing to the vacuum piping in the vacuum chamber.

5. A charged particle beam device, comprising:

a charged particle optical system configured to introduce charged particle beams emitted from a charged particle source onto a sample; and an evacuation structure to evacuate the charged particle optical system, wherein the evacuation structure includes:

a vacuum chamber provided with the charged particle source;

vacuum piping connected to the vacuum chamber;

a main vacuum pump connected via the vacuum piping and configured to evacuate the inside of the vacuum chamber;

a non-evaporable getter pump disposed at a position between the vacuum chamber and the main vacuum pump in the vacuum piping;

a coarse evacuation port connected to a position between the main vacuum pump and the non-evaporable getter pump in the vacuum piping, and including a coarse evacuation valve configured to open and close the coarse evacuation port and a leak valve to open the vacuum chamber to the atmosphere; and an air introducing guide disposed at a connecting position between the coarse evacuation port and the vacuum piping, and an introduction port of the air introducing guide extends up to the vacuum chamber side beyond the non-evaporable getter pump.

\* \* \* \* \*